324-77
4/15/80   XR   4,198,599

United States Patent [19]
Krider et al.

[11] 4,198,599
[45] Apr. 15, 1980

[54] GATED LIGHTNING DETECTION SYSTEM

[75] Inventors: Edmund P. Krider; Ralph C. Noggle, both of Tucson, Ariz.

[73] Assignee: The University of Arizona Foundation, Tucson, Ariz.

[21] Appl. No.: 929,751

[22] Filed: Jul. 31, 1978

[51] Int. Cl.² .............................................. G01R 31/02
[52] U.S. Cl. .................................... 324/72; 324/77 R
[58] Field of Search ......................... 324/72, 77 A, 96; 73/170 R; 340/172

[56] References Cited

U.S. PATENT DOCUMENTS

| | | | |
|---|---|---|---|
| 3,715,660 | 2/1973 | Ruhnke | 324/72 |
| 3,790,884 | 2/1974 | Kohl | 73/170 |
| 4,100,487 | 7/1978 | Fletcher | 324/96 |
| 4,115,732 | 9/1978 | Krider | 324/72 |

Primary Examiner—M. Tokar
Attorney, Agent, or Firm—Mason, Kolehmainen, Rathburn & Wyss

[57] ABSTRACT

A lightning detection system utilizes a gated magnetic direction finder for determining the range and direction of lightning discharges to ground. The magnetic direction finder is controlled by an electric field detector that includes logic circuitry for analyzing the waveforms of the detected electric field to determine whether the discharge is a ground stroke or other type of discharge, or background noise. The magnetic direction finder is gated by the electric field control logic circuitry so that a direction measurement may be made for a few microseconds after it has been determined from the electric field waveform analysis that a ground stroke has occurred. Different criteria are used for determining whether or not a stroke is a ground stroke depending on whether the stroke being analyzed is the first stroke in a flash or a subsequent stroke.

19 Claims, 4 Drawing Figures

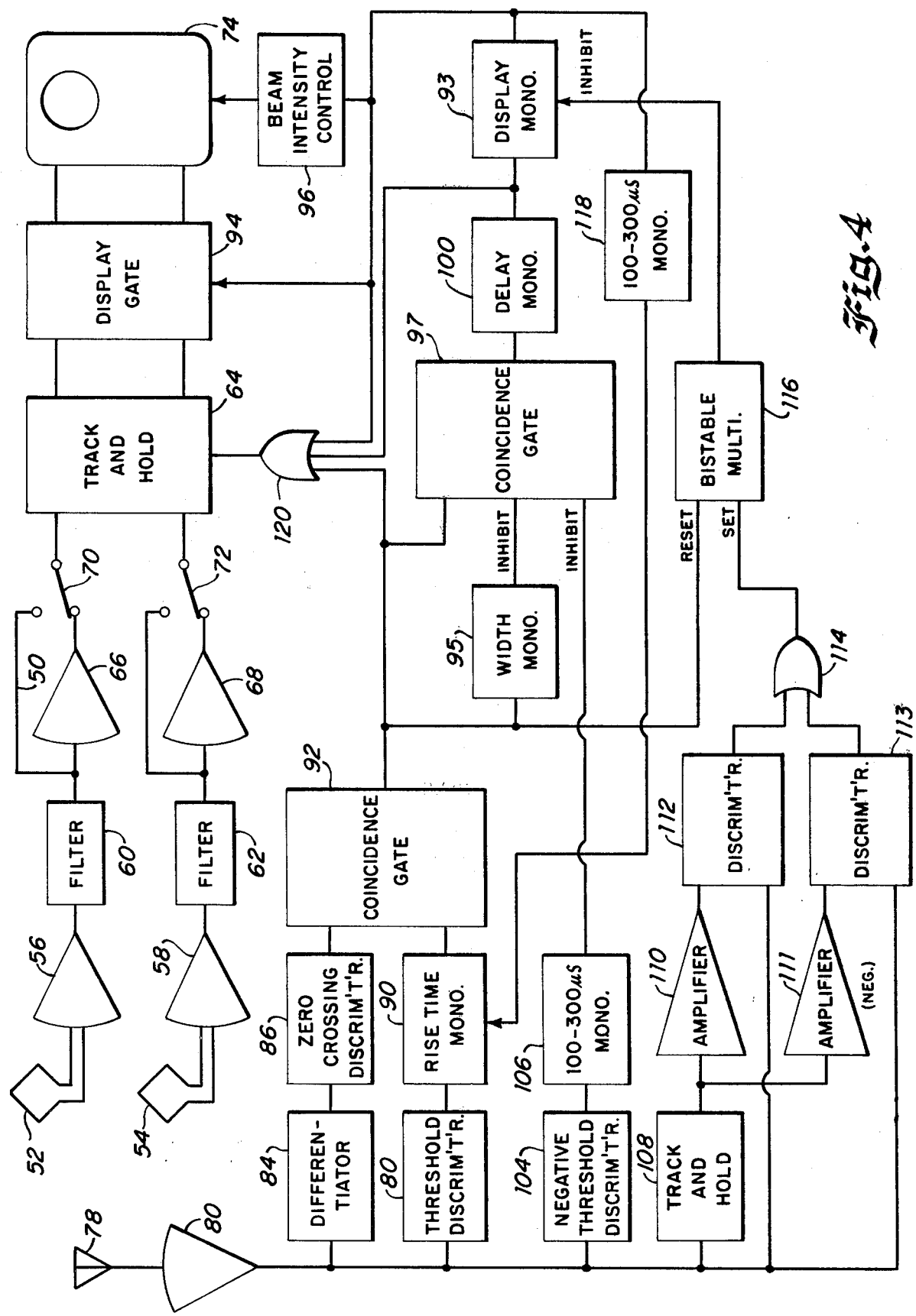

GATED LIGHTNING DETECTION SYSTEM

BACKGROUND OF THE INVENTION

1. Field of the Invention

The present invention relates generally to lightning detection systems, and more particularly, to lightning detection systems utilizing a gated magnetic direction finder and waveform analyzing circuitry for rendering the magnetic direction finder operative to measure the direction of the lightning discharge for only the initial few microseconds of the discharge, and only after it has been determined from an analysis of the detected waveform that a ground stroke has occurred.

2. Description of the Prior Art

In many applications, it is often necessary to determine accurate locations of lightning discharges to ground. For example, accurate knowledge of lightning discharges aids in the precise location of forest fires and power system damage, and is useful in providing an indication of the path of an approaching thunderstorm so that recreational areas, such as golf courses and swimming pools in the path of the storm may be safely evacuated.

Several systems for locating lightning discharges are known. Among such systems are systems that utilize a magnetic cathode ray direction finder employing a pair of orthogonal loop antennas tuned to a VLF frequency, typically 10 kHz, for detecting the horizontal magnetic field produced by the lightning discharge. Such systems range from simple magnetic direction finders wherein the outputs of the orthogonal antennas are simultaneously applied to the X and Y inputs of an X-Y oscilloscope to generate a vector display indicating the direction of the lightning to more sophisticated systems that use gating and waveform analysis techniques that permit the vector to be displayed only when the detected field has certain predetermined characteristics indicative of a ground stroke. A lightning detection system using gating and waveform analysis techniques is described in U.S. patent application Ser. No. 732,365, filed Oct. 14, 1976, now Pat. No. 4,115,732 and incorporated herein by reference.

While these systems do provide a way to detect lightning discharges, the accuracy of conventional ungated cathode ray detectors is poor at distances of less than about 200 kilometers because the magnetic field sensing antennas sense the magnetic field generated by the entire discharge, including the field generated by horizontally and diagonally extending branches, as well as ionospheric reflections. Such effects result in bearing errors in excess of 20° at distances of about 200 kilometers, and substantially larger errors for distances of less than 20 kilometers. The system disclosed in the above-mentioned application Ser. No. 732,365 and now U.S. Pat. No. 4,115,732 uses waveform analysis and gating techniques in an attempt to reduce the effects of magnetic fields generated by sources other than the main vertical channel of the stroke extending from the ground. The gating and waveform analysis results in a substantial increase in accuracy; however, the system is not designed to sense the polarity of the field generated by the stroke, and thus resulting in a 180° ambiguity to some strokes. Furthermore, the system is not designed to have different waveform analyzing criteria for an initial stroke and subsequent strokes. Also, the system has some difficulty in rejecting certain types of invalid lightning signals and some difficulty is encountered in measuring the exact width of a lightning signal.

SUMMARY OF THE INVENTION

Accordingly, it is an object of the present invention to provide an improved lightning detection system that overcomes many of the disadvantages of the prior art systems.

It is another object of the present invention to provide an improvement on the system disclosed in U.S. patent application Ser. No. 732,365, now U.S. Pat. No. 4,115,732.

It is still another object of the present invention to provide a lightning detection system that senses the polarity of the field generated by a lightning stroke in order to eliminate a possible 180° ambiguity.

It is yet another object of the invention to provide a lightning detection system that senses the electric field of a lightning discharge and analyzes the waveform of the signal obtained by sensing the electric field to control a direction finder that senses the magnetic field of the discharge.

It is still another object of the present invention to utilize different criteria for determining whether the waveform generated by the electric field represents a ground stroke depending on whether the stroke is the initial stroke of a flash or a subsequent stroke.

It is yet another object of the present invention to provide an improved lightning detection system that does not respond to a stroke if certain events occur within a predetermined time prior to and subsequent to the occurrence of a peak in the field generated by the stroke.

In accordance with a preferred embodiment of the invention, two vertical and orthogonal wide band magnetic field antenna elements are used to detect the horizontal component of the magnetic field produced by lightning discharges. A wide band omnidirectional electric field antenna is used to sense the electric field produced by the discharges. Since the output of each antenna is a time derivative of the magnetic or electric field, the output is integrated to restore the original magnetic or electric field waveform. The magnetic field waveform is applied to a track and hold circuit, either directly or through a second integrator. The integrated output of the electric field antenna is applied to waveform analyzing circuitry including a peak detector. If the received electric field signal reaches its peak within a predetermined time interval and remains above a threshold level in excess of the predetermined time period, the logic circuit indicates a valid ground stroke has occurred and displays the contents of the track and hold circuit on a display device, such as an X-Y oscilloscope or a plotter to determine the direction of the strike. However, in order for the logic circuit to indicate a valid ground stroke, the stroke signal must not be preceded by an invalid signal within a predetermined time period, nor can the stroke signal be either preceded or followed by a reverse polarity signal within a predetermined time interval. Finally, since the subsequent strokes in a flash differ from a first stroke in that subsequent strokes have a faster rise time and shorter duration than the first stroke, circuitry is provided for changing the criteria for determining whether a stroke is a ground stroke, depending on whether the stroke being detected is the initial stroke of a flash or a subsequent stroke. Such criteria changes generally include a reduction in the rise time and pulse duration requirements for a subsequent stroke.

BRIEF DESCRIPTION OF THE DRAWING

These and other objects and advantages of the present invention will be readily understood by reference to the following detailed description and attached drawing, wherein:

FIG. 4 is a block diagram of the lightning detector according to the invention.

DETAILED DESCRIPTION OF THE PREFERRED EMBODIMENT

In order to understand the operation of the lightning detection system according to the present invention, the mechanism of lightning generation must first be understood. The mechanism of lightning detection is discussed in detail in the referenced patent application Ser. No. 732,365; however, pertinent portions of that discussion will be repeated here to aid in the understanding of the present invention.

A typical lightning flash to ground is made up of several component strokes. A discharge to ground starts with a faint stepped leader which proceeds rather slowly from cloud to ground in a series of short luminous steps which generate an ionized path along the path of travel of the stepped leader. When the stepped leader contacts the ground, a bright, high energy, return stroke propagates rapidly up the ionized path established by the stepped leader. After a pause of 30 to 50 milliseconds, a new leader, known as a dart leader proceeds uniformly from cloud to ground and is followed by another bright upwardly propagating return stroke. A typical lightning flash to ground is made up of three or four leader-return stroke combinations. Typical return strokes have very high peak currents, usually in the range of 20,000 to 40,000 amperes.

The present invention makes use of the fact that the electric and magnetic field generated by a ground stroke has a characteristic waveform that is different from the waveforms of other types of discharges and most sources of background noise. Thus, a ground stroke can be distinguished from other types of strokes and background noise by waveform analysis, and the system can be made responsive only to strokes that generate the characteristic waveform. Once it has been established by waveform analysis that a stroke is indeed a ground stroke, the direction of the stroke may be accurately determined by gating the direction finding techniques.

Figure 1:
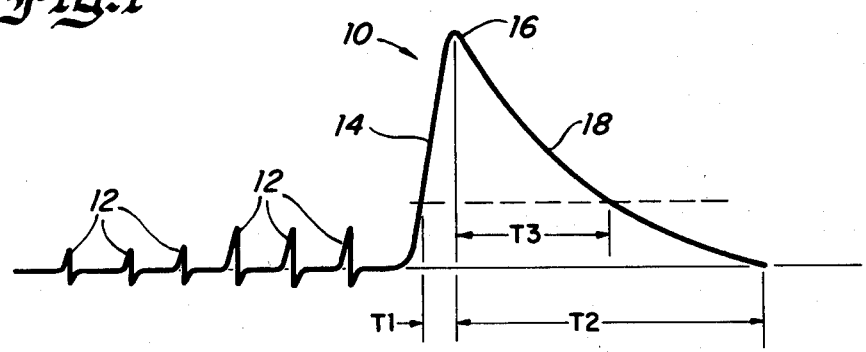
FIGS. 1-3 depict the waveforms produced by various types of lightning strokes.
Figure 2:
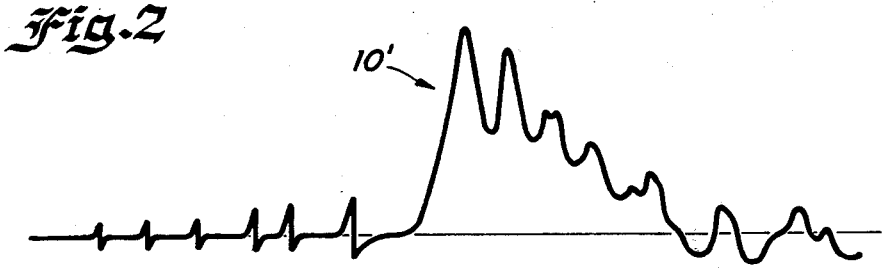

A ground stroke of the type described in the foregoing generates a magnetic field and an electric field, either of which, when detected by a respective one of the antennas used with the detector of the present invention, provides a waveform similar to that waveform 10 illustrated in FIG. 1. The actual waveform is somewhat more complicated as a result of multiple reflections and other phenomena and is actually shaped more like the waveform 10' illustrated in FIG. 2, and one or more large secondary peaks following the initial peak. The waveform 10 illustrated in FIG. 1 has been simplified for purposes of clarity to illustrate the relatively fast rise time and slower decay of the detected waveform generated by a ground stroke.

In general, as the stepped leader progresses down from the cloud to ground, a series of relatively low amplitude spikes 12 (FIG. 1) are generated, each such spike being generated by a respective step in the downwardly progressing steps of the stepped leader. Typically, the spikes 12 occur at 20 to 50 microsecond intervals. After the stepped leader reaches ground, the return stroke is evidenced by a rapid rise 14 in the waveform 10 that rapidly reaches a peak value 16 and decays along an exponential curve 18. In a typical, the rise time T1 ranges from 1 to 15 microseconds and the decay time is approximately 20 to 40 microseconds. As previously described, subsequent return strokes in the same flash are preceded by a dart leader rather than a stepped leader, and hence, no spikes similar to the spikes 12 precede the waveform 20 (FIG. 3) generated by a subsequent return stroke. The rise time of a subsequent return stroke is generally faster than that of an initial return stroke, and its duration shorter. For example, the rise time T1 from a predetermined threshold to a peak is typically 12 microseconds for an initial stroke and 5-8 microseconds for a subsequent stroke. The decay time T2 from the peak to a zero crossing is typically 20-30 microseconds for an initial stroke and 10-20 microseconds for a subsequent stroke. Also, the decay portion of a subsequent stroke waveform lacks the one or more large secondary peaks characteristic of the first return stroke.

The smooth, rapid rise to a relatively high peak followed by a unipolar decay characterizes the signal produced by a return stroke to ground occurring within approximately 200 miles of the receiver, while intracloud strokes and distant ground strokes produce more complex bipolar waveforms similar to those of stepped leaders, and do not exhibit such a rapid, smooth rise time nor such a high peak. These waveforms may also have fast rise time spikes superimposed on a slow rise, and thus bear some resemblance to a return stroke signal. However, by utilizing circuitry within the system that is responsive only to a signal having a rapid, smooth rise to a peak and the slower unipolar decay characterizing the beginning of a ground return stroke signal, the system is made nonresponsive to spurious signals. By requiring that the signal have a unipolar decay, signals produced by distant ground strokes which do not constitute an immediate danger can also be rejected. Thus, the system can be made to provide a measure of discrimination between close and distant ground strokes. Moreover, by requiring that no invalid stroke signal may be received within a predetermined time prior to the rapid rise, and by further requiring that the waveform does not exceed a predetermined negative threshold within a predetermined time interval prior to or subsequent to the rise to the peak, further rejection of spurious signals and signals resulting from intracloud discharges is obtained. Also, once it has been determined that a waveform is representative of a true ground stroke, the parameters of the waveform analyzing circuitry may be altered to tailor the system in order to make it responsive to waveforms generated by subsequent ground strokes of the type illustrated in FIG. 3.

Such tailoring could require a subsequent stroke to have a faster rise time and narrower width than an initial stroke. For example, the timing circuitry could be adjusted to require that the rise time T1 (FIG. 1) be 12 microseconds or less for an initial stroke and 8 microseconds or less for a subsequent stroke. Similarly, the decay time T2 from the peak to a zero crossing could be required to be at least 15 microseconds for an initial stroke and at least 10 microseconds for a subsequent stroke. Moreover, the logic circuitry could be programmed to require the spike 12 generated by the spiked leader to be present in a first stroke. In subsequent strokes, such spikes would not be required, or it could be required that such spikes not be present. Similarly, the logic circuitry could be adjusted to require a second peak within a predetermined time interval following the occurrence of the first peak in an initial stroke, but not in a subsequent stroke, or the circuitry could be adjusted to require the absence of a second peak in an initial stroke.

Once it has been determined by the waveform analyzing system that the received waveform is representative of a true ground stroke, the magnetic direction finder is gated for a predetermined time period so that only the initial peak of the waveform is used to obtain directional information. Since the initial peak is generated by the relatively straight vertical portion of the ground stroke, a more accurate indication of the direction of the ground stroke will result. Thus, the system is made nonresponsive to intracloud flashes and to certain classes of background noise. Moreover, the system will not be affected by subsequent branching and horizontal portions of the return stroke.

Referring now to FIG. 4, there is illustrated a generalized block diagram of the lightning detection system according to the invention, generally designated by the reference numeral 50. The block diagram illustrated in FIG. 4 is similar to the system illustrated in FIG. 4 of the previously referenced patent application Ser. No. 732,365. Many of the blocks illustrated in FIG. 4 are similar to the blocks described in patent application Ser. No. 732,365, and are described in greater detail in the referenced patent application.

The detection system 50 utilizes a pair of orthogonally positioned magnetic antennas 52 and 54 which, in a preferred embodiment, may be loop antennas, such as those described in Krider, et al. "Broadband Antenna Systems for Lightning Magnetic Fields", *Journal of Applied Meterology*, Vol. 14, No. 2, March 1975, pp. 252-256. The plane of the antenna 52 is positioned to face, for example, in a north-south direction, and the plane of the antenna 54 is positioned to face, for example, in an east-west direction. Consequently, the antenna 52 receives the north-south component of the magnetic field of any lightning discharge, and the antenna 54 receives the east-west component.

The outputs of the antennas 52 and 54, which are proportional to the time derivative of the received magnetic field signals, are integrated by a pair of respective integrators 56 and 58, to provide a signal representative of the field itself. The integrated signals from the integrators 56 and 58 are filtered by a pair of filter circuits 60 and 62, to remove undesirable interfering signals such as broadcast stations, and applied to track and hold circuits 64 either directly or through a second pair of integrators 66 and 68 which may be selected by a pair of switches 70 and 72. A display gate 94 couples the output of the track and hold circuits 64 to a display unit such as, for example, an X-Y oscilloscope 74.

An omnidirectional electric field antenna 78 provides a signal representative of the time derivative of the received electric field to an integrator 80. The time derivative signal is integrated by the integrator 80 in order to generate a signal representative of the received electric field. The electric field representative signal is applied to logic circuitry that analyzes the waveform of the electric field signal and renders the track and hold circuits 64 and the display gate 94 operative to display the magnetic field signals on the X-Y oscilloscope 74 when all of the criteria imposed by logic circuitry to indicate that the received signal has the characteristics of the waveform produced by a ground stroke. Alternatively, the absolute values of the outputs of the magnetic field integrators 56 and 58 may be summed and used to drive the waveform analyzing circuitry, but it has been found advantageous to use a separate electric field antenna and integrator since the output of the electric field integrator can also be used to provide an indication of the polarity of the stroke, and an omnidirectional electric field antenna provides more constant detection efficiency with azimuth than do two magnetic field antennas coupled to a summing circuit.

The output of the integrator 80 is applied to a differentiator 84 which drives a zero crossing discriminator 86. The output of the integrator 80 is also applied to a threshold discriminator 88 and a rise time gate 90. The outputs of the zero crossing discriminator 86 and rise time gate 90 are applied to a coincidence gate 92 which controls the track and hold circuits 64 through a three input OR gate 120.

The integrators 66 and 68 serve to integrate the signals from the respective integrators 56 and 58. The once or twice integrated signals from the various integrators are received by the track and hold circuits 64 which track each of the once or twice integrated signals and provide output signals proportional to the instantaneous magnitudes of each of the input signals upon receipt of a display signal to the display gate 94. The switches 70 and 72 select the signals corresponding to the once or twice integrated signals for application to the track and hold circuits 64.

The waveform analyzing circuitry coupled to the electric field antenna 78 serves to control the application of the once or twice integrated signals received from the magnetic field antennas 52 and 54 to the X-Y oscilloscope 74. In the present embodiment, when the signal from the integrator 80 reaches a predetermined level determined by the threshold discriminator 88, the threshold discriminator 88 provides a signal to the rise time gate 90 which, in turn, enables the coincidence gate 92 for a predetermined time interval (usually 5 to 10 microseconds and variable depending on whether the detected stroke is a first stroke or a subsequent stroke) after the threshold has been exceeded. The differentiator circuit 84 provides an output signal proportional to the slope of the signal from the integrator 80. When the signal from the integrator 80 reaches a peak, its slope is zero, and therefore, the output of the differentiator 84 is also zero (corresponding to the peak 16 of FIG. 1). The zero output from the differentiator 84 is detected by the zero crossing discriminator 86 which provides a signal to the coincidence gate 92 when the received signal reaches its peak. If the signal from the zero crossing discriminator 86 is received by the coincidence gate 92 during the enabling pulse from the rise time gate 90, the coincidence gate 92 will trigger the track and hold circuits 64 through the OR gate 120. The coincidence gate 92 will also provide a signal to a coincidence gate 97 and trigger the monostable multivibrator 95 which inhibits the coincidence gate 97 for a time of typically 10-15 microseconds. This insures that the waveform must not recross the threshold of discriminator 88 for at least this 10-15 microsecond time period.

As can be seen from the foregoing, in order for a received magnetic field signal to be acquired by the track and hold circuits 64, the received electric field signal (or summed magnetic field signals) must have a characteristic similar to the waveform illustrated in FIG. 1. The peak 16 of the signal must exceed a predetermined amplitude 102 determined by the threshold discriminator 88. Furthermore, the peak 16 of the waveform must occur within the time interval set by the rise time gate 90, for example, T1 must be less than the typical (5 to 10 microsecond) window provided by the rise time gate 90. Furthermore, the waveform must remain above the threshold 102 for a time after the peak 16 which is determined by the monostable multivibrator 95.

The operation of the system as heretofore described is similar to the system disclosed in the previously referenced patent application Ser. No. 732,365, except that a separate electric field antenna and associated integrator are used to drive the logic circuitry and that a pulse width criterion has been added. However, in accordance with an important aspect of the invention, additional criteria are interposed on the waveform analysis to prevent a stroke from being displayed under certain conditions where it would have been displayed by the prior art system. In the system according to the present invention, a stroke will not be displayed unless there has been no invalid signal within a predetermined interval, typically 100-300 microseconds prior to the receipt of an otherwise valid stroke. The stroke will not be displayed if any waveform has exceeded a predetermined negative threshold within a predetermined time interval, typically 100-300 microseconds, prior to the receipt of the otherwise valid stroke, and that no predetermined positive or negative threshold is exceeded within a predetermined time interval, also typically 100-300 microseconds, after the receipt of a peak. The term negative as used herein is intended to mean in a direction opposite the direction of the peak 16, since the waveform may be inverted at various points in the circuit.

The above is accomplished by utilizing a negative threshold sensor 104 that provides a signal to a monostable multivibrator 106 whenever the signal received from the integrator 80 exceeds a predetermined negative threshold. The monostable multivibrator provides a predetermined width inhibiting pulse, typically 100-300 microseconds, to the coincidence gate 92. Thus, if the signal from the integrator 80 exceeds a predetermined negative threshold within 100 to 300 microseconds prior to the occurrence of a peak, the coincidence gate 92 will be inhibited to prevent the peak from being displayed.

When the coincidence gate 92 provides a signal to the OR gate 120, it also triggers a monostable multivibrator 100 which has a time period of 100-300 microseconds. If at the end of this 100-300 microsecond time the display monostable multivibrator 93 has not received an inhibit signal from a bistable multivibrator 116, the multivibrator 93 is triggered by the monostable multivibrator 100 and switches the signals from the track and hold circuits 64 to the oscilloscope 74.

The signal from the track and hold circuit 108 is amplified in the amplifier 110 by a factor which is typically 1 to 1.5, and in the amplifier 111 by a factor of typically negative 0.5 to 1.5. If the signal from the integrator 80 exceeds the output of amplifier 110, a discriminator 112 provides a signal to an OR gate 114. Similarly, if the signal from the integrator 80 is more negative than the output of an amplifier 111, a discriminator 113 provides a signal to an OR gate 114. If the OR gate 114 receives a signal from either of the respective discriminators 112 or 113, the OR gate 114 causes a bistable multivibrator 116 to be set such that its output inhibits the triggering of the display monostable multivibrator 93. The bistable multivibrator 116 is reset by the coincidence gate 92 when the peak 16 of the waveform occurs to insure its readiness during each waveform. The effect of the foregoing is to inhibit the display gate 93 when the waveform from the integrator 80 exceeds certain positive or negative fractions of the peak value within a certain time after the peak. The signals from the coincidence gate 92, the display monostable multivibrator 93 and the delay monostable multivibrator 100 are all provided to the OR gate 120 to insure that the signals are held in the track and hold circuits 64 for the entire duration of the logic sequence for each waveform.

The display monostable multivibrator 93 also activates the beam intensity control 96, causing the beam of the oscilloscope 74 to be unblanked, thus causing the signals from the track and hold circuits 64 to be displayed. Thus, in order for a received magnetic field signal to be displayed on the X-Y oscilloscope 74, the received electric field signal (or summed magnetic field signals) must not only have the characteristic shown in FIG. 1, but must not be preceded or followed by any waveform greater than certain respective amplitudes for certain respective periods of time.

Figure 3:
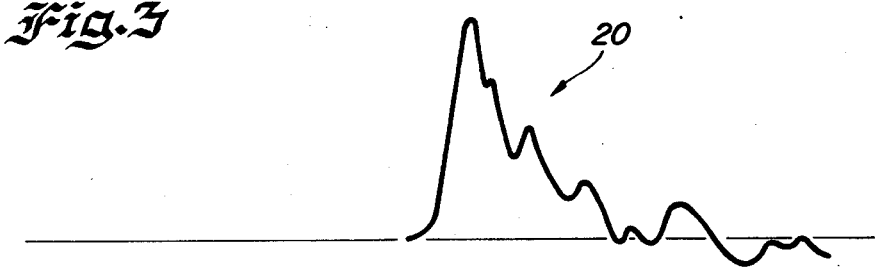

Finally, once a first valid ground stroke is detected, the timing of the rise time gate 90 is altered to tailor it to respond only to subsequent strokes similar to those shown in FIG. 3. This is accomplished by a monostable multivibrator 118 which alters the response of the threshold discriminator 88 and the rise time gate 90 for a period of time, typically 300 milliseconds, subsequent to the receipt of each valid stroke. The occurrence of a valid stroke is determined by the presence of an output signal from the display monostable multivibrator 94. Thus, if a waveform is determined to represent a valid ground stroke, as determined by the output of the coincidence gate 92, and the ground stroke is not found to be invalid for other reasons, as determined by the outputs of the monostable multivibrator 106 and the OR gate 114, the display monostable multivibrator 94 causes the monostable multivibrator 118 to alter the characteristics of the rise time gate 90 for 300 microseconds following the occurrence of each valid stroke.

Obviously, many modifications and variations of the present invention are possible in light of the above teachings. Thus, it is to be understood that, within the scope of the appended claims, the invention may be practiced otherwise than as specifically described above.

What is claimed and desired to be secured by Letters Patent of the United States is:

1. A lightning detection system comprising:
   means for detecting the magnetic field produced by a lightning discharge and for providing signals representative of the amplitude and direction of said magnetic field relative to said system;
   means for sampling portions of said signals and providing representations of said sampled portions;
   means for utilizing said representations to generate an indication of the direction of said discharge relative to said system; and
   means for detecting the amplitude of the electric field produced by said lightning discharge and for rendering said sampling means operative to sample said portion of said signals only after the amplitude of said electric field exceeds a predetermined level.

2. A lightning detection system as recited in claim 1 wherein said electric field amplitude sensing means includes means for detecting the peak of said electric field and for rendering said sampling means operative to sample said signals upon the occurrence of said peak.

3. A lightning detection system as recited in claim 2 further including means for inhibiting the sampling of said portions of said signals if the amplitude of said electric field exceeds a predetermined negative threshold within a predetermined time interval prior to the detection of said peak.

4. A lightning detection system as recited in claim 3 wherein said predetermined time interval is in the range of approximately 100-300 microseconds.

5. A lightning detection system as recited in claim 2 further including means for inhibiting the sampling of said portions of said signals if the amplitude of said electric field exceeds a predetermined threshold within a predetermined time interval subsequent to the detection of said peak.

6. A lightning detection system as recited in claim 5 wherein said predetermined threshold is a predetermined negative threshold.

7. A lightning detection system as recited in claim 5 wherein said predetermined threshold is a predetermined positive threshold.

8. A lightning detection system as recited in claim 5 wherein said predetermined time interval is in the range of approximately 100-300 microseconds.

9. A lightning detection system as recited in claim 5 further including means for inhibiting the display of said portions of said signals if the amplitude of said electric field drops below a predetermined level within less than a preselected time interval following the occurrence of said peak.

10. A lightning detection system as recited in claim 2 further including means for inhibiting the sampling of said portions of said signal upon the detection of an electric field produced by a lightning discharge other than a discharge to ground within a predetermined time interval prior to the detection of said peak.

11. A lightning detection system as recited in claim 10 wherein said predetermined time interval is on the order of approximately 100-300 microseconds.

12. A lightning detection system comprising:
means for detecting the field produced by a lightning discharge and for providing signals representative of the amplitude and direction of said field relative to said system;
means for sampling portions of said signals and providing representations of said sampled portions;
means for utilizing said representations to generate an indication of the direction of said discharge relative to said system; and
control means for rendering said sampling means operative to sample said portions of said signals only after the amplitude of said field exceeds a predetermined level, wherein said control means includes means for detecting the peak of said field and for rendering said sampling means operative to sample said signals upon the occurrence of said peak, said control means further including means for inhibiting the sampling of portions of said signals if the amplitude of said field exceeds a predetermined negative threshold within a predetermined time interval prior to the detection of said peak.

13. A lightning detection system as recited in claim 12 wherein said predetermined time interval is in the range of approximately 100-300 microseconds.

14. A lightning detection system comprising:
means for detecting the field produced by a lightning discharge and for providing signals representative of the amplitude and direction of said field relative to said system;
means for sampling portions of said signals and providing representations of said sampled portions;
means for utilizing said representations to generate an indication of the direction of said discharge relative to said system; and
control means for rendering said sampling means operative to sample said portions of said signals only after the amplitude of the field exceeds a predetermined level, wherein said control means includes means for detecting the peak of said field and for rendering said sampling means operative to sample said signals upon the occurrence of said peak, said control means further including means for inhibiting the sampling of portions of said signals if the amplitude of said field exceeds a predetermined threshold within a predetermined time interval subsequent to the detection of said peak.

15. A lightning detection system as recited in claim 11 wherein said predetermined threshold is a predetermined negative threshold.

16. A lightning detection system as recited in claim 11 wherein said predetermined threshold is a predetermined positive threshold.

17. A lightning detection system comprising:
means for detecting the field produced by a lightning discharge and for providing signals representative of the amplitude and direction of said field relative to said system;
means for sampling portions of said signals and providing representations of said sampled portions;
means for utilizing said representations to generate an indication of the direction of said discharge relative to said system; and
control means for rendering said sampling means operative to sample said portion of said signal only after the amplitude of the field exceeds a predetermined level, wherein said control means includes means for detecting the peak of said field and for rendering said sampling means operative to sample said signals upon the occurrence of said peak, said control means further including means for inhibiting the sampling of said portions of said signals upon the detection of a field produced by a source other than a lightning discharge to ground within a predetermined time interval prior to the detection of said peak.

18. A lightning detection system comprising:
means for detecting the field produced by a lightning discharge and for providing signals representative of the amplitude and direction of said field relative to said system;
means for sampling portions of said signals and providing representations of said sampled portions;
means for utilizing said representations to generate an indication of the direction of said discharge relative to said system; and
control means for rendering said sampling means operative to sample said portions of said signals only after the amplitude of the field exceeds a predetermined level, wherein said control means includes means for detecting the peak of said field and for rendering said sampling means operative to sample said signals upon the occurrence of said peak within a predetermined time interval after said level has exceeded said predetermined level, said control means further including means for altering said predetermined time interval for a second predetermined time interval following the occurrence of said sampling.

19. A lightning detection system as recited in claim 18 wherein said second predetermined time interval is in the range of approximately 100-300 microseconds.

* * * * *